United States Patent
Hasegawa et al.

(10) Patent No.: US 7,465,424 B2
(45) Date of Patent: Dec. 16, 2008

(54) SPUTTERING TARGET MATERIAL

(75) Inventors: Koichi Hasegawa, Soka (JP); Nobuo Ishii, Soka (JP); Tomoyoshi Asaki, Soka (JP)

(73) Assignee: Ishifuku Metal Industry Co., Ltd., Tokyo (JP)

( * ) Notice: Subject to any disclaimer, the term of this patent is extended or adjusted under 35 U.S.C. 154(b) by 254 days.

(21) Appl. No.: 10/470,414

(22) PCT Filed: Mar. 15, 2002

(86) PCT No.: PCT/JP02/02466

§ 371 (c)(1),
(2), (4) Date: Jul. 29, 2003

(87) PCT Pub. No.: WO02/077317

PCT Pub. Date: Oct. 3, 2002

(65) Prior Publication Data

US 2004/0055882 A1     Mar. 25, 2004

(30) Foreign Application Priority Data

Mar. 16, 2001    (JP) ............................. 2001-076132

(51) Int. Cl.
*C22C 5/06* (2006.01)
(52) U.S. Cl. .................. 420/505; 420/503; 148/430; 428/64.1; 428/64.4
(58) Field of Classification Search ............ 148/430; 420/501–506, 64.2; 428/64.4, 64.1
See application file for complete search history.

(56) References Cited

U.S. PATENT DOCUMENTS

| 5,093,174 A | 3/1992 | Suzuki et al. |
| 5,612,133 A | 3/1997 | Mori et al. |
| 6,544,616 B2 * | 4/2003 | Nee .......................... 428/64.1 |

FOREIGN PATENT DOCUMENTS

| EP | 1 069 194 | 1/2001 |
| EP | 1 174 868 | 1/2002 |
| JP | 3-156753 | 7/1991 |
| JP | 7-3363 | 1/1995 |
| JP | 9-111380 | 4/1997 |
| JP | 10143917 A * | 5/1998 |
| JP | 10-177742 | 6/1998 |
| JP | 11-25515 | 1/1999 |
| JP | 2000-109943 | 4/2000 |
| JP | 2000-226626 | 8/2000 |
| JP | 2001-357559 | 12/2001 |
| JP | 2001357559 A * | 12/2001 |
| JP | 2002-235130 | 8/2002 |
| WO | 99/01584 | 1/1999 |

* cited by examiner

*Primary Examiner*—Roy King
*Assistant Examiner*—Janelle Morillo
(74) *Attorney, Agent, or Firm*—Wenderoth, Lind & Ponack, L.L.P.

(57) ABSTRACT

Provided is a sputtering target material which has a high reflectance and which is excellent in a sulfurization resistance, comprising an Ag alloy prepared by alloying Ag with a specific small amount of the metal component (A) selected from In, Sn and Zn, a specific small amount of the metal component (B) selected from Au, Pd and Pt and, if necessary, a small amount of Cu.

30 Claims, No Drawings

SPUTTERING TARGET MATERIAL

TECHNICAL FIELD

The present invention relates to a sputtering target material for forming a thin film which is improved in a corrosion resistance, particularly a halogen resistance, an acid resistance and a sulfurization resistance while maintaining a high reflectance and to a thin film formed by using this sputtering target material.

BACKGROUND ART

In general, Al and Al alloys are used for a reflecting film used for optical recording media such as CD (compact disc), DVD (digital versatile disc) and the like and a light-reflective conductive film used for displays such as a reflection type STN (super twist nematic) liquid crystal display, an organic EL (electro luminescence) display and the like.

A light-reflective thin film used for uses such as the optical recording media, the liquid crystal display and the organic EL display each described above is usually produced by preparing a sputtering target material having a desired quality and forming a film using this sputtering target material by an RF (radio frequency) sputtering method and a DC (direct current) sputtering method.

The thin films comprising Al and Al alloys which are produced by the methods described above have a reflectance of some extent and a low electric resistance and forms a passive coating film on a surface, so that it has a stable corrosion resistance as well in the air. However, the thin films comprising Al and Al alloys have a reflectance of about 80% in the case of, for example, light having a wavelength of 700 nm, and it is not sufficiently satisfactory to uses in which the high reflectance is required.

Accordingly, it is proposed to use Au and Ag as a sputtering target material in place of Al and Al alloys for optical disc media represented by, for example, CD-R and DVD to form a thin film. Further, it is proposed to use Ag having a high reflectance as a thin film material as well for a reflection type STN liquid crystal display.

However, Au is expensive, and Ag has problems on a corrosion resistance, particularly a halogen resistance (Cl and others), an acid resistance and a sulfurization resistance as compared with Al. For example, if Ag is reacted with a halogen element such as Cl, it is discolored and reduced in a reflectance, and if Ag is reacted with sulfur and oxygen, a sulfide and an oxide of Ag are formed to blacken the film and reduce a reflectance thereof.

Thus, it is proposed to elevate a corrosion resistance (a halogen resistance, an acid resistance and a sulfurization resistance) by adding a small amount of Mg to Ag to turn them into an alloy in Japanese Patent Application Laid-Open No. 3363/1995 and by adding a small amount of Pd to Ag to turn them into an alloy in Japanese Patent Application Laid-Open No.109943/2000. Further, an AgAu alloy improved in recording sensitivity and a C/N ratio by adding 5 to 50 at % of Au to Ag is disclosed in Japanese Patent Application Laid-Open No. 156753/1991.

However, a satisfactory corrosion resistance of Ag is not obtained by these Ag alloys, and still present is the problem that the corrosion resistance, particularly the halogen (Cl and the like) resistance is elevated to some extent but the sulfurization resistance is not so different from that of Ag, so that the satisfactory corrosion resistance is not obtained.

An object of the present invention is to provide a sputtering target material for forming a thin film, comprising an Ag alloy which is improved in a corrosion resistance, particularly a halogen resistance, an acid resistance and a sulfurization resistance while maintaining a high reflectance and a thin film formed using the above sputtering target material.

DISCLOSURE OF THE INVENTION

Intensive investigations repeated by the present inventors in order to achieve the object described above have resulted in finding that if a specific small amount of at least one of In, Sn and Zn and a specific small amount of at least one of Au, Pd and Pt are alloyed with Ag, these both metal components synergistically work to provide an Ag alloy which is markedly improved in a corrosion resistance, particularly a halogen resistance, an acid resistance and a sulfurization resistance while maintaining a high reflectance and that if a small amount of Cu is alloyed with Ag, the corrosion resistance, particularly the halogen resistance, the acid resistance and the sulfurization resistance are further more elevated, and they have come to complete the present invention.

Thus, the present invention provides a sputtering target material for forming a high corrosion resistant thin film having a high reflectance, comprising an Ag alloy which is prepared by blending Ag with a at least one metal component (A) selected from 0.1 to 2.0 mass % of In, 0.1 to 2.0 mass % of Sn and 0.1 to 2.0 mass % of Zn in an amount of 0.1 to 2.0 mass % in total and at least one metal component (B) selected from 0.1 to 0.9 mass % of Au, 0.1 to 4.9 mass % of Pd and 0.1 to 0.9 mass % of Pt in an amount of 0.1 to 4.9 mass % in total and in which the total content of the metal component (A) and the metal component (B) is 0.2 to 5.0 mass %.

Also, the present invention provides a sputtering target material for forming a high corrosion resistant thin film having a high reflectance, comprising an Ag alloy which is prepared by blending Ag with at least one metal component (A) selected from 0.05 to 2.0 mass % of In, 0.05 to 2.0 mass % of Sn and 0.05 to 2.0 mass % of Zn in an amount of 0.05 to 2.0 mass % in total, at least one metal component (B) selected from 0.1 to 0.9 mass % of Au, 0.1 to 4.9 mass % of Pd and 0.1 to 0.9 mass % of Pt in an amount of 0.1 to 4.9 mass % in total and 0.05 to 2.0 mass % of Cu and in which the total content of the metal component (A), the metal component (B) and Cu is 0.2 to 5.0 mass %.

Further, the present invention provides a thin film of an Ag alloy which is prepared by blending Ag with at least one metal component (A) selected from 0.1 to 2.0 mass % of In, 0.1 to 2.0 mass % of Sn and 0.1 to 2.0 mass % of Zn in an amount of 0.1 to 2.0 mass % in total and at least one metal component (B) selected from 0.1 to 0.9 mass % of Au, 0.1 to 4.9 mass % of Pd and 0.1 to 0.9 mass % of Pt in an amount of 0.1 to 4.9 mass % in total and in which the total content of the metal component (A) and the metal component (B) is 0.2 to 5.0 mass %.

Also, the present invention provides a thin film of an Ag alloy which is prepared by blending Ag with at least one metal component (A) selected from 0.05 to 2.0 mass % of In, 0.05 to 2.0 mass % of Sn and 0.05 to 2.0 mass % of Zn in an amount of 0.05 to 2.0 mass % in total, at least one metal component (B) selected from 0.1 to 0.9 mass % of Au, 0.1 to 4.9 mass % of Pd and 0.1 to 0.9 mass % of Pt in an amount of 0.1 to 4.9 mass % in total and 0.05 to 2.0 mass % of Cu and in which the total content of the metal component (A), the metal component (B) and Cu is 0.2 to 5.0 mass %.

The present invention shall be explained below in further details.

The sputtering target material of the present invention comprises an Ag alloy which is based on Ag and prepared by alloying it with the metal component (A) selected from In, Sn and Zn and the metal component (B) selected from Au, Pd and Pt.

In, Sn and Zn each can be used alone as the metal component (A) or may be used in combination of two or three kinds thereof. In these metal components (A), In is used in a range of 0.1 to 2.0 mass %, preferably 0.1 to 1.5 mass %; Sn is used in a range of 0.1 to 2.0 mass %, preferably 0.1 to 1.0 mass %; and Zn is used in a range of 0.1 to 2.0 mass %, preferably 0.1 to 1.5 mass %. The Ag alloy of the present invention can contain these metal components (A) in a range of 0.1 to 2.0 mass %, preferably 0.1 to 1.5 mass % in total.

If the metal component (A) described above has a content of less than 0.1 mass %, the satisfactory corrosion resistance, particularly the sulfurization resistance can not be obtained, and if it exceeds 2.0 mass %, a thin film formed from the resulting Ag alloy is likely to be reduced in a reflectance and increased in an electrical resistance.

Further, Au, Pd and Pt each can be used alone as the metal component (B) described above or may be used in combination of two or three kinds thereof. In these metal components (B), Au is used in a range of 0.1 to 0.9 mass %, preferably 0.2 to 0.8 mass %; Pd is used in a range of 0.1 to 4.9 mass %, preferably 0.2 to 2.0 mass %; and Pt is used in a range of 0.1 to 0.9 mass %, preferably 0.2 to 0.8 mass %. The Ag alloy of the present invention can contain these metal components (A) in a range of 0.1 to 4.9 mass %, preferably 0.2 to 0.9 mass % in total.

If the metal component (B) described above has a content of less than 0.1 mass %, the satisfactory corrosion resistance, particularly the halogen resistance and the acid resistance can not be obtained. On the other hand, if Au and Pt have a content exceeding 0.9 mass %, it is likely that when the resulting Ag alloy is used for a reflector of liquid crystal to which a patterning property is required, Au and Pt remain undissolved in patterning carried out by wet etching and that they remain as a residue on a substrate subjected to patterning to bring about discrepancy. Further, if Pd has a content exceeding 4.9 mass %, a thin film formed from the resulting Ag alloy is likely to be reduced in a reflectance.

A relative ratio of the metal component (A) to the metal component (B) in the Ag alloy shall not specifically be restricted and can optionally be changed within the ranges of the foregoing contents of the respective metal components.

Further, the total content of the metal component (A) and the metal component (B) in the Ag alloy can fall in a range of 0.2 to 5.0 mass %, preferably 0.3 to 2.0 mass %.

If the total content of the metal component (A) and the metal component (B) is less than 0.2 mass %, the satisfactory corrosion resistance can not be obtained. On the other hand, if it exceeds 5.0 mass %, a thin film formed from the resulting Ag alloy is likely to be reduced in a reflectance.

The Ag alloy can be produced, for example, by blending Ag with the metal component (A) (In, Sn and Zn) and the metal component (B) (Au, Pd and Pt) each described above in the foregoing amounts and melting them at about 1,000 to about 1,050° C. in a suitable metal melting furnace such as a gas furnace and a high frequency melting furnace. They can be molten in an environment of the air without having any problems, but an inert gas environment or vacuum may be used if necessary.

Those which are commercially available in the form of a particle, a plate or a bulk can be used for the metal component (A) (In, Sn and Zn) and the metal component (B) (Au, Pd and Pt) which are used as the raw materials. Usually, those having a purity 99.9% or more, particularly 99.95% or more are suitably used.

Thus, obtained is an Ag alloy containing the metal component (A) and the metal component (B) in Ag in the proportions described above respectively. The sputtering target material constituted from this Ag alloy maintains a high reflectance which is essentially held by Ag. In addition thereto, it is far more improved in a corrosion resistance such as a halogen resistance (particularly Cl), an acid resistance and a sulfurization resistance as compared with conventional Ag-Mg alloys, Ag-Pd alloys and Ag-Au alloys.

In a reflection type STN liquid crystal display and an organic EL display, a conductivity (usually, an electrical resistance is 7 $\mu\Omega\cdot$cm or less, preferably 3 $\mu\Omega\cdot$cm or less) is required to a light-reflective thin film depending on the use modes thereof. Also, when it is used as a reflector, it has to be subjected to patterning in a slit form, and therefore a patterning property is required. Further, in an optical disc medium represented by CD-R and DVD, a reflection type STN liquid crystal display and an organic EL display, a heat resistant characteristic is required as well. The sputtering target material provided by the present invention has a low electrical resistance and shows a good patterning property, and it is excellent as well in a heat resistance and satisfies the required characteristics described above.

Accordingly, the sputtering target material of the present invention which is constituted from the Ag alloy described above can advantageously be used for forming a reflection film for an optical disc medium represented by CD-R and DVD to which a high reflectance is required and used for forming a light-reflective thin film for a reflection type STN liquid crystal display and an organic EL display.

Further, it has been found in the present invention that in addition to the metal component (A) (In, Sn and Zn) and the metal component (B) (Au, Pd and Pt) each described above, Cu is further added to Ag and molten into an alloy in the same manner as described above, whereby obtained is a sputtering target material which is further more improved in a corrosion resistance such as a halogen resistance, an acid resistance and a sulfurization resistance while maintaining a high reflectance and which has a low electrical resistance and is excellent in a patterning property and a heat resistance.

In this case, in the metal component (A), In is used in a range of 0.05 to 2.0 mass %, preferably 0.1 to 1.5 mass %; Sn is used in a range of 0.05 to 2.0 mass %, preferably 0.1 to 1.0 mass %; and Zn is used in a range of 0.05 to 2.0 mass %, preferably 0.1 to 1.5 mass %. The Cu-added Ag alloy thus formed can contain these metal components (A) in a range of 0.05 to 2.0 mass %, preferably 0.1 to 1.5 mass % in total.

Further, the metal component (B) can be used in the same proportion as described above. That is, in the metal component (B), Au is used in a range of 0.1 to 0.9 mass %, preferably 0.2 to 0.8 mass %; Pd is used in a range of 0.1 to 4.9 mass %, preferably 0.2 to 2.0 mass %; and Pt is used in a range of 0.1 to 0.9 mass %, preferably 0.2 to 0.8 mass %. The Ag alloy formed can contain these metal components (B) in a range of 0.1 to 4.9 mass %, preferably 0.2 to 0.9 mass % in total.

Further, Cu can be added in a range of 0.05 to 2.0 mass %, preferably 0.1 to 1.5 mass %.

If Cu has a content of less than 0.05 mass % and the total content of Cu and the metal component (A) is less than 0.1 mass %, 30 the satisfactory corrosion resistance, particularly the satisfactory sulfurization resistance is not obtained. On the other hand, if Cu has a content of exceeding 2.0 mass %, the Cu component is oxidized by load of heat in uses to which a heat resistance is required, so that the thin film is likely to be reduced in a reflectance in a short wavelength area.

The Cu-added Ag alloy formed can contain the metal component (A), the metal component (B) and Cu in a range of 0.2 to 5.0 mass %, preferably 0.5 to 2.0 mass % in total.

Further, a relative ratio of the metal component (A), the metal component (B) and Cu in the Cu-added Ag alloy shall not specifically be restricted and can optionally be changed within the ranges of the foregoing contents of the respective metal components.

A reflection film can be formed from the sputtering target material constituted from the Ag alloy of the present invention by conventionally known sputtering methods, for example, a high frequency (RF) sputtering method, a direct current (DC) sputtering method and a magnetron sputtering method.

The present invention shall more specifically be explained below with reference to examples.

EXAMPLES

Examples 1-1 to 1-7, Comparative Examples 1-1 to 1-6 and Conventional Examples 1-1 to 1-2

Added to Ag were the metal component (A) (In, Sn and Zn), the metal component (B) (Au, Pd and Pt) and, if necessary, Cu, and they were molten in a gas furnace of about 1,050° C. by heating. Then it was cast in a mold to produce a sputtering target material having a composition shown in the following Table 1.

TABLE 1

| | Sample No. | Composition |
|---|---|---|
| Example | 1-1 | Ag-1 mass % In-0.7 mass % Pd |
| | 1-2 | Ag-1 mass % Zn-0.5 mass % Au |
| | 1-3 | Ag-0.8 mass % Sn-0.6 mass % Au-02 mass % Pd |
| | 1-4 | Ag-0.5 mass % In-0.6 mass % Au-0.2 mass % Pt |
| | 1-5 | Ag-0.8 mass % In-0.5 mass % Au-0.5 mass % Cu |
| | 1-6 | Ag-0.7 mass % Sn-0.7 mass % Pt |
| | 1-7 | Ag-0.3 mass % In-0.7 mass % Pd |
| Comparative Example | 1-1 | Ag-0.01 mass % Zn-0.01 mass % Au-0.1 mass % Cu |
| | 1-2 | Ag-2 mass % In-4 mass % Pd |
| | 1-3 | Ag-1 mass % Au |
| | 1-4 | Ag-1 mass % Pd |
| | 1-5 | Ag-1 mass % Au-1 mass % Ti |
| | 1-6 | Ag-1 mass % Sn |
| Conventional Example | 1-1 | Ag |
| | 1-2 | Ag-0.9 mass % Pd-1 mass % Cu |

This sputtering target material was used to obtain a thin film with a thickness of about 200 nm having the same composition as that shown in Table 1 on a glass substrate by an RF sputtering method.

The glass substrate thus obtained on which the thin film was adhered was exposed in the air to test an acid resistance. Further, different glass substrates on which the thin film was adhered each were dipped in a 10% sodium chloride (NaCl) aqueous solution and a 0.01 sodium sulfide ($Na_2S$) aqueous solution to test a halogen (chlorine) resistance and a sulfurization resistance. In the respective tests, the state of the thin films after prescribed time was passed was visually evaluated. The results thereof are shown in the following Table 2.

TABLE 2

| | | Weatherability test result | | |
|---|---|---|---|---|
| | | Air exposing test (left in air) Exposing time | Dipping test (10% NaCl aqueous solution) Dipping time | |
| | Sample No. | 24 hr | 10 hr | 24 hr |
| Example | 1-1 | No change | No change | No change |
| | 1-2 | No change | No change | No change |
| | 1-3 | No change | No change | No change |
| | 1-4 | No change | No change | No change |
| | 1-5 | No change | No change | No change |
| | 1-6 | No change | No change | No change |
| | 1-7 | No change | No change | No change |
| Comparative Example | 1-1 | Discolored to light brown | Discolored to yellow | Discolored to yellow |
| | 1-2 | No change | No change | No change |
| | 1-3 | No change | No change | No change |
| | 1-4 | No change | No change | No change |
| | 1-5 | No change | No change | No change |
| | 1-6 | Discolored to light brown | Discolored to yellow | Discolored to yellow |
| Conventional Example | 1-1 | Discolored to light brown (partially dark brown) | Discolored to yellow | Discolored to yellow |
| | 1-2 | No change | No change | No change |

| | | Sulfurization resistance test result Dipping test (0.01% $Na_2S$ aqueous solution) | | |
|---|---|---|---|---|
| | Sample No. | Dipping time | | |
| | | 3 minutes | 10 minutes | 30 minutes |
| Example | 1-1 | No change | Discolored to very light brown | Discolored to light brown |
| | 1-2 | No change | Discolored to very light brown | Discolored to light brown |
| | 1-3 | No change | Discolored to very light brown | Discolored to light brown |
| | 1-4 | No change | Discolored to very light brown | Discolored to light brown |
| | 1-5 | No change | Discolored to very light brown | Discolored to light brown |

TABLE 2-continued

|  |  |  |  |  |
|---|---|---|---|---|
|  | 1-6 | No change | Discolored to very light brown | Discolored to light brown |
|  | 1-7 | No change | Discolored to very light brown | Discolored to light brown |
| Comparative | 1-1 | Brown | Blackish purple | Blackish purple |
| Example | 1-2 | No change | Discolored to very light brown | Discolored to light brown |
|  | 1-3 | Discolored to very light brown | Discolored to brown | Discolored to dark brown |
|  | 1-4 | Discolored to very light brown | Discolored to brown | Discolored to dark brown |
|  | 1-5 | Discolored to very light brown | Discolored to brown | Discolored to dark brown |
|  | 1-6 | No change | Discolored to very light brown | Discolored to light brown |
| Conventional | 1-1 | Brown | Blackish purple | Blackish purple |
| Example | 1-2 | Discolored to very light brown | Discolored to brown | Discolored to dark brown |

As apparent from the results shown in Table 2, no change was observed on the thin films prepared in Examples 1-1 to 1-7 in the air exposing test and the dipping test in a 10% NaCl aqueous solution. On the other hand, discoloration took place on the thin films prepared in Comparative Examples 1-1 and 1-6 and Conventional Example 1-1.

Further, comparison of the thin films prepared in Examples 1-1 to 1-7 with the thin films prepared in Comparative Example 1-1, Comparative Examples 1-3 to 1-5 and Conventional Examples 1-1 to 1-2 makes it apparent that the thin films prepared in the examples are delayed in the progress state of discoloration as compared with the thin films prepared in the comparative examples and the conventional examples and that they are improved in a sulfurization resistance. According to Comparative Example 1-5, it can be found that when a transition metal such as Ti is substituted for the metal component (A) of the present invention, the resulting Ag alloy is not improved in a sulfurization resistance.

Further, measurement of a reflectance of light (vertical incident light) in a wavelength area of 500 to 700 nm on the resulting thin films shows that all of the thin films prepared in Examples 1-1 to 1-7 had a reflectance of 90% or more, but the thin films prepared in Comparative Example 1-2 had as low reflectance as 80 to 90%.

It can be found from the results described above that the Ag alloy of the present invention is improved in a corrosion resistance while having a high reflectance.

Further, measured for an electrical resistance were the plate materials of the Ag alloys prepared in Examples 1-1 to 1-7 and the Ag alloy prepared in Comparative Example 1-2. The results thereof are shown in Table 3.

TABLE 3

|  | Sample No. | Electrical resistivity $\rho/\mu\Omega \cdot cm$ |
|---|---|---|
| Example | 1-1 | 2.5 |
|  | 1-2 | 2.0 |
|  | 1-3 | 4.8 |
|  | 1-4 | 3.2 |
|  | 1-5 | 2.9 |
|  | 1-6 | 6.4 |
|  | 1-7 | 2.3 |
| Comparative Example | 1-2 | 7.9 |

As apparent from the results shown in Table 3, all of the Ag alloys according to the present invention have an electrical resistance of 7 $\mu\Omega\cdot$cm or less. On the other hand, as shown in Comparative Example 1-2, the Ag alloy in which the total content of the metal component (A) and the metal component (B) is large has an electrical resistance of larger than 7 $\mu\Omega\cdot$cm or less.

In DVD-R and CD-R, a dye compound containing a halogen element (Cl, Br, I and the like) is applied as a recording layer on a disc-like substrate as described in Japanese Patent Application Laid-Open No. 321110/1999 and Japanese Patent Application Laid-Open No. 43420/2000, and a reflective layer and a protective layer are further provided thereon. When halogen ions contained in these dye compounds are adhered onto Ag, Ag is discolored. For example, when the dye is decomposed and the halogen ions contained in the dye are adhered onto the Ag reflective layer, it is reacted with the halogen ions and discolored to reduce a reflectance. This allows a halogen resistance to be required to an Ag alloy used in the fields where dyes are used as is the case with DVD-R and CD-R. In order to investigate such reactivity with halogen ions, the plate materials of Ag alloys having compositions shown in Table 4 were prepared in the same manner as described above and dipped in various test solutions shown in Table 5 to investigate the degree of discoloration by means of a color-difference meter. When Ag is reacted with halogen ions, it is discolored to yellow, and therefore the degrees of yellow were compared to evaluate the corrosion resistance. The results thereof are shown in Table 5.

TABLE 4

|  | Sample No. | Composition |
|---|---|---|
| Example | 2-1 | Ag-1 mass % In-0.7 mass % Pd |
|  | 2-2 | Ag-1 mass % Sn-0.8 mass % Au |
|  | 2-3 | Ag-0.8 mass % Zn-0.8 mass % Au |
| Comparative Example | 2-1 | Ag-0.01 mass % Zn-0.01 mass % Au-0.1 mass % Cu |
|  | 2-2 | Ag-1 mass % Au |
|  | 2-3 | Ag-1 mass % Sn |
|  | 2-4 | Ag-1 mass % Ti-1 mass % Au |
|  | 2-5 | Ag-1 mass % Mg-1 mass % Au |
| Conventional Example | 2-1 | Ag |
|  | 2-2 | Ag-0.9 mass % Pd-1 mass % Cu |
|  | 2-3 | Ag-1 mass % Mg |

TABLE 5

|  | Sample No. | Test solution | |
|---|---|---|---|
|  |  | 10% Sodium chlorate aqueous solution | 10% Potassium iodide aqueous solution |
|  |  | Dipping time | |
|  |  | 380 hours Color difference b (= +yellow/−blue) | 24 hours Color difference b (= +yellow/−blue) |
| Example | 2-1 | 0.45 | 0.03 |
|  | 2-2 | 0.80 | 0.52 |
|  | 2-3 | 0.41 | 0.65 |
| Comparative Example | 2-1 | 4.80 | 8.53 |
|  | 2-2 | 1.65 | 1.31 |
|  | 2-3 | 2.89 | 4.19 |
|  | 2-4 | 1.85 | 1.56 |
|  | 2-5 | 2.03 | 1.87 |
| Conventional Example | 2-1 | 4.78 | 8.80 |
|  | 2-2 | 2.19 | 2.44 |
|  | 2-3 | 3.65 | 5.00 |

It is shown that in the color difference b in Table 5, a yellow color is stronger at a plus side and that a blue color is stronger at a minus side. It can be found from the results shown in Table 5 that the value of the color difference in the plate materials of the Ag alloys prepared in Examples 2-1 to 2-3 does not exceed 1 and they are less discolored to yellow and that they have a low reactivity with a chlorine ion and an iodine ion and are excellent in a halogen resistance.

On the other hand, when the addition amounts of Zn, Au and Cu are small as is the case with Comparative Example 2-1, discoloration is liable to take place. In the case of a binary system as is the case with Comparative Examples 2-2 to 2-3, a discoloration-inhibiting effect is observed to some extent, but it can be found that the satisfactory effect is not obtained as compared with the cases of a ternary system as is the case with the examples. Further, the synergistic effect observed in the present invention is not obtained even in the ternary system when a transition metal such as Ti and an element such as Mg other than In, Sn and Zn which are the metal components (A) according to the present invention are added as is the case with Comparative Example 2-4. Further, it can be found that the color difference b value is large in the conventional examples as compared with those of the examples and that discoloration is liable to be caused.

Further, when the Ag alloy is used for those related to liquid crystal and reflecting films in DVD, DVD-RW and DVD-RAM, they are exposed to a high temperature in a certain case depending on the use conditions thereof. For example, when a thin film of pure silver is exposed to a temperature of 200° C. or higher, the film causes coagulation to become turbid and white, and it is reduced in a reflectance in a certain case. Accordingly, a stability of the film against heat is required in these uses.

Then, Ag alloys having compositions shown in the following Table 6 were prepared in order to investigate a thermal stability of the Ag alloys of the present invention, and they were used to form films on a glass substrate by an RF sputtering method so that a film thickness of 150 nm was obtained to investigate a thermal stability of the films.

TABLE 6

|  | Sample No. | Composition |
|---|---|---|
| Example | 3-1 | Ag-1.0 mass % In-0.7 mass % Pd |
|  | 3-2 | Ag-0.8 mass % Sn-0.6 mass % Au-0.2 mass % Pd |
|  | 3-3 | Ag-1.0 mass % Zn-0.8 mass % Au |
|  | 3-4 | Ag-0.2 mass % Zn-0.5 mass % Au |
|  | 3-5 | Ag-0.2 mass % Zn-0.6 mass % Pd |
|  | 3-6 | Ag-0.3 mass % In-0.7 mass % Pd |
| Comparative Example | 3-1 | Ag-0.5 mass % Au |
|  | 3-2 | Ag-0.2 mass % Zn-0.6 mass % Au-4.0 mass % Cu |
| Conventional Example | 3-1 | Ag |
|  | 3-2 | Ag-0.9 mass % Pd-1 mass % Cu |

In respect to the investigating method, a reflectance of the film before test was determined, and then it was subjected to heat treatment at 250° C. in the air for one hour. A reflectance thereof was measured again to calculate a change rate of the reflectance according to the following calculating equation:

$$\text{change rate (\%)} = \frac{\text{(reflectance after test)}}{\text{(reflectance before test)}} \times 100$$

The results thereof are shown in Table 7.

TABLE 7

|  |  |  | Change rate (%) | |
|---|---|---|---|---|
|  |  |  | After test | |
|  | Sample No. | Before test | Measuring wavelength 400 nm | Measuring wavelength 700 nm |
| Example | 3-1 | 100 | 94 | 100 |
|  | 3-2 | 100 | 97 | 100 |
|  | 3-3 | 100 | 97 | 99 |
|  | 3-4 | 100 | 97 | 100 |
|  | 3-5 | 100 | 98 | 100 |
|  | 3-6 | 100 | 97 | 100 |
| Comparative Example | 3-1 | 100 | 92 | 100 |
|  | 3-2 | 100 | 87 | 98 |
| Conventional Example | 3-1 | 100 | 84 | 99 |
|  | 3-2 | 100 | 90 | 100 |

It can be found from the results shown in Table 7 that little change is observed on the respective samples in a measuring wavelength of 700 nm but the thin films prepared in Examples 3-1 to 3-6 have a change rate of 94% or more in the case of a measuring wavelength of 400 nm and that they are excellent in a thermal stability. On the other hand, the Ag films prepared in Comparative Example 3-2 and Conventional Example 3-1 have a change rate of 90% or less in a measuring wavelength of 400 nm. The Ag films prepared in Comparative Example 3-1 and Conventional Example 3-2 have a change rate of 90% or more, but they are low as compared with those of Examples 3-1 to 3-6.

Further, it can be found from comparison of Example 3-4 with Comparative Example 3-1 that the thin film containing Zn prepared in Examples 3-4 has a change rate of 98% and is thermally very stable but the thin film containing no Zn prepared in Comparative Example 3-1 has a change rate of 92% and is improved in a thermal stability by adding Au and Zn in combination according to the present invention.

When the Ag alloy is used for a semipermeable reflector film such as liquid crystal, a patterning characteristic by wet etching is required for the sake of wiring. Then, Ag alloys having compositions shown in the following Table 8 were prepared and used for patterning by wet etching to investigate the characteristics thereof. A mixed solution of phosphoric acid, nitric acid, acetic acid and water was used for wet etching. The results thereof are shown in Table 9.

TABLE 8

|  | Sample No. | Composition |
|---|---|---|
| Example | 4-1 | Ag-0.8 mass % In-0.3 mass % Pt |
|  | 4-2 | Ag-1.0 mass % Zn-0.5 mass % Au |
|  | 4-3 | Ag-1.0 mass % Zn-2.0 mass % Pd |
| Comparative | 4-1 | Ag-0.8 mass % Sn-2.0 mass % Au |
| Example | 4-2 | Ag-0.8 mass % Sn-2.0 mass % Pt |

TABLE 9

|  | Sample No. | Evaluation | Remarks |
|---|---|---|---|
| Example | 4-1 | ○ | Good |
|  | 4-2 | ○ | Good |
|  | 4-3 | ○ | Good |
| Comparative | 4-1 | X | Residue present |
| Example | 4-2 | X | Residue present |

Evaluation criteria
○: no residue is adhered on the substrate
X: residue is adhered on the substrate As can be found from the results shown in Table 9, the good results were obtained in Examples 4-1 to 4-3, but in Comparative Examples 4-1 to 4-2, residues (Au and Pt) remained partially undissolved after etching and were adhered on the substrate. An increase in the residues deteriorates the patterning property.

The invention claimed is:

1. A sputtering target material for forming a high corrosion resistant thin film having a high reflectance, consisting of an Ag alloy which consists of a blend of Ag with at least one metal component (A) selected from 0.1 to 2.0 mass % of In and 0.1 to 2.0 mass % of Sn in an amount of 0.1 to 2.0 mass % in total and at least one metal component (B) selected from 0.1 to 0.9 mass % of Au, 0.1 to 4.9 mass % of Pd and 0.1 to 0.9 mass % of Pt in an amount of 0.1 to 4.9 mass % in total and in which the total content of the metal component (A) and the metal component (B) is 0.2 to 5.0 mass %.

2. A sputtering target material for forming a high corrosion resistant thin film having a high reflectance, consisting of an Ag alloy which consists of a blend of Ag with at least one metal component (A) selected from 0.05 to 2.0 mass % of In and 0.05 to 2.0 mass % of Sn in an amount of 0.05 to 2.0 mass % in total, at least metal component (B) selected from 0.1 to 0.9 mass % of Au, 0.1 to 4.9 mass % of Pd and 0.1 to 0.9 mass % of Pt in an amount of 0.1 to 4.9 mass % in total and 0.05 to 2.0 mass % of Cu and in which the total content of the metal component (A), the metal component (B) and Cu is 0.2 to 5.0 mass %.

3. The sputtering target material as described in claim 1, wherein the metal component (A) is at least one selected from 0.1 to 1.5 mass % of In and 0.1 to 1.0 mass % of Sn.

4. The sputtering target material as described in claim 1, wherein the total content of the metal component (A) is 0.1 to 1.5 mass %.

5. The sputtering target material as described in claim 1, wherein the metal component (B) is at least one selected from 0.2 to 0.8 mass % of Au, 0.2 to 2.0 mass % of Pd and 0.2 to 0.8 mass % of Pt.

6. The sputtering target material as described in claim 1, wherein the total content of the metal component (B) is 0.2 to 0.9 mass %.

7. The sputtering target material as described in claim 1, wherein the total content of the metal component (A) and the metal component (B) is 0.3 to 2.0 mass %.

8. The sputtering target material as described in claim 2, wherein Cu has a content of 0.1 to 1.5 mass %.

9. The sputtering target material as described in claim 2, wherein the total content of the metal component (A), the metal component (B) and Cu is 0.5 to 2.0 mass %.

10. A thin film of an Ag alloy which consists of a blend of Ag with at least one metal component (A) selected from 0.1 to 2.0 mass % of In and 0.1 to 2.0 mass % of Sn in an amount of 0.1 to 2.0 mass % in total and at least one metal component (B) selected from 0.1 to 0.9 mass % of Au, 0.1 to 4.9 mass % of Pd and 0.1 to 0.9 mass % of Pt in an amount of 0.1 to 4.9 mass % in total and in which the total content of the metal component (A) and the metal component (B) is 0.2 to 5.0 mass %.

11. A thin film of an Ag alloy which consists of a blend of Ag with at least one metal component (A) selected from 0.05 to 2.0 mass % of In and 0.05 to 2.0 mass % of Sn in an amount of 0.05 to 2.0 mass % in total, at least one metal component (B) selected from 0.1 to 0.9 mass % of Au, 0.1 to 4.9 mass % of Pd and 0.1 to 0.9 mass % of Pt in an amount of 0.1 to 4.9 mass % in total and 0.05 to 2.0 mass % of Cu and in which the total content of the metal component (A), the metal component (B) and Cu is 0.2 to 5.0 mass %.

12. The thin film as described in claim 10, wherein the metal component (A) is at least one selected from 0.1 to 1.5 mass % of In and 0.1 to 1.0 mass % of Sn.

13. The thin film as described in claim 10, wherein the total content of the metal component (A) is 0.1 to 1.5 mass %.

14. The thin film as described in claim 10, wherein the metal component (B) is at least one selected from 0.2 to 0.8 mass % of Au, 0.2 to 2.0 mass % of Pd and 0.2 to 0.8 mass % of Pt.

15. The thin film as described in claim 10, wherein the total content of the metal component (B) is 0.2 to 0.9 mass %.

16. The thin film as described in claim 10, wherein the total content of the metal component (A) and the metal component (B) is 0.3 to 2.0 mass %.

17. The thin film as described in claim 11, wherein Cu has a content of 0.1 to 1.5 mass %.

18. The thin film as described in claim 11, wherein the total content of the metal component (A), the metal component (B) and Cu is 0.5 to 2.0 mass %.

19. An optical disc medium comprising the thin film as described in claim 10.

20. A reflection type STN liquid crystal display and an organic EL display prepared by using the thin film as described in claim 10.

21. The sputtering target material as described in claim 2, wherein the metal component (A) is at least one selected from 0.1 to 1.5 mass % of In and 0.1 to 1.0 mass % of Sn.

22. The sputtering target material as described in claim 2, wherein the total content of the metal component (A) is 0.1 to 1.5 mass %.

23. The sputtering target material as described in claim 2, wherein the metal component (B) is at least one selected from 0.2 to 0.8 mass % of Au, 0.2 to 2.0 mass % of Pd and 0.2 to 0.8 mass % of Pt.

24. The sputtering target material as described in claim 2, wherein the total content of the metal component (B) is 0.2 to 0.9 mass %.

25. The thin film as described in claim 11, wherein the metal component (A) is at least one selected from 0.1 to 1.5 mass % of In and 0.1 to 1.0 mass % of Sn.

26. The thin film as described in claim 11, wherein the total content of the metal component (A) is 0.1 to 1.5 mass %.

27. The thin film as described in claim 11, wherein the metal component (B) is at least one selected from 0.2 to 0.8 mass % of Au, 0.2 to 2.0 mass % of Pd and 0.2 to 0.8 mass % of Pt.

28. The thin film as described in claim 11, wherein the total content of the metal component (B) is 0.2 to 0.9 mass %.

29. An optical disc medium comprising the thin film as described in claim 11.

30. A reflection type STN liquid crystal display and an organic EL display prepared by using the thin film as described in claim 11.

* * * * *